United States Patent [19]

Marchand et al.

[11] 4,380,830

[45] Apr. 19, 1983

[54] MICROWAVE UP-CONVERTER

[75] Inventors: Maurice Marchand; Christian Petijean, both of Colombes, France

[73] Assignee: L.M.T. Radio Professionelle, Colombes, France

[21] Appl. No.: 283,724

[22] Filed: Jul. 15, 1981

[30] Foreign Application Priority Data

Jul. 18, 1980 [FR] France ................................ 80 15906

[51] Int. Cl.³ .............................................. H04B 1/26
[52] U.S. Cl. ..................................... 455/327; 455/330; 455/332
[58] Field of Search ............... 455/326, 327, 328, 330, 455/332; 332/24, 43 B; 330/4.9

[56] References Cited

U.S. PATENT DOCUMENTS

| | | | |
|---|---|---|---|
| 2,789,210 | 4/1957 | Arnold | 455/326 |
| 3,310,748 | 3/1967 | Putnam | 455/327 |
| 3,772,599 | 11/1973 | Ernst et al. | 455/327 |
| 3,870,960 | 3/1975 | Hallford et al. | 455/327 |
| 3,943,450 | 3/1976 | Otremba | 455/327 |
| 4,008,438 | 2/1977 | Shinkawa et al. | 455/327 |
| 4,031,472 | 6/1977 | Shinkawa et al. | 455/327 |

FOREIGN PATENT DOCUMENTS

| | | |
|---|---|---|
| 1197134 | 7/1965 | Fed. Rep. of Germany . |
| 2241918 | 3/1975 | France . |
| 1121790 | 7/1968 | United Kingdom . |
| 1345577 | 1/1974 | United Kingdom . |

*Primary Examiner*—Jin F. Ng
*Attorney, Agent, or Firm*—Cushman, Darby & Cushman

[57] ABSTRACT

An up converter having on the one hand an ultrahigh-frequency ring receiving one of the waves to be mixed and on the other hand a transformer receiving the other wave to be mixed whose frequency is in the radio-electric range. The transformer is connected to the ring through a bridge of mixer diodes which are placed with this transformer and a capacitor for tuning this latter inside the ring. The resulting wave exits from the ring through a waveguide having two traps tuned to the frequency of the wave applied to the ring.

6 Claims, 2 Drawing Figures

MICROWAVE UP-CONVERTER

BACKGROUND OF THE INVENTION

The present invention relates to up converters which, from two radio-electric signals, allow a third radio-electric signal to be obtained whose frequency is higher than that of the first two signals. Such up converters are particularly useful for coherent Doppler radars in which all the signals are obtained from a local quartz oscillator whose frequency and phase are very stable.

In a particular embodiment of such a radar, as local oscillator a quartz is used whose frequency is 60 MHz. This frequency is relatively low, but it is difficult to cause a quartz to oscillate at a higher frequency, especially while maintaining its characteristics of precision and stability. So as to obtain the transmission signal it is then necessary to multiply the frequency of the signal supplied by the quartz. This multiplication is effected with the help of a whole conversion chain. In this chain we find particularly a mixer in which a signal at a frequency of 60 MHz is added to a signal at a frequency of 1800 MHz. The signal at the output of this mixer has then a frequency of 1860 MHz. This frequency is higher than that of the input signal, which is a rather unusual characteristic, and this is why this mixer is termed up converter.

The mixers commercially available may operate by stepping up the frequency. It has however been noted that their efficiency is then considerably inferior and is characterized for example by a drop of the output level greater than four decibels between the two operating modes. In addition, this relatively acceptable result is only obtained if the frequencies of the signals to be mixed are not too far apart from each other. This is clearly not the case in the mixer of the above-described radar.

It is usual for mixers operating up to frequencies of the order of 1500 MHz to form them by winding balanced transformers on magnetic cores such as ferrite beads or pots.

Beyond this frequency of 1500 MHz, most often a so-called microstrip hybrid technology is used comprising couplers or rings.

In the case of this radar, the lowest frequency justifies use of the wound technology and the highest frequency the hybrid technology. These two technologies are also called localized constant technology and spread constant technology. If a mixer is constructed with one of other of these technologies in this case, the losses will be too great in the windings on the ferrite for the 1800 MHz signal and the dimensions of the hybrid couplers will be prohibitive for the 60 MHz signal.

BRIEF SUMMARY OF THE INVENTION

To get over these difficulties, the invention provides an up converter for mixing a first radio-frequency wave with a second ultrahigh-frequency wave and obtaining a third ultrahigh-frequency wave, which comprises:
  a mixer diode bridge;
  a coil for feeding the first wave to the mixer diode bridge;
  a microstrip ring;
  a first microstrip waveguide for feeding the second wave to this ring;
  a second and a third microstrip waveguide for connecting the diode bridge to the ring;
  a third microstrip waveguide for extracting the third wave from the ring.

BRIEF DESCRIPTION OF THE DRAWINGS

Other features and advantages of the invention will become clear from the following description given by way of nonlimiting example with reference to the following accompanying figures.

DETAILED DESCRIPTION OF THE INVENTION

Figure 1:
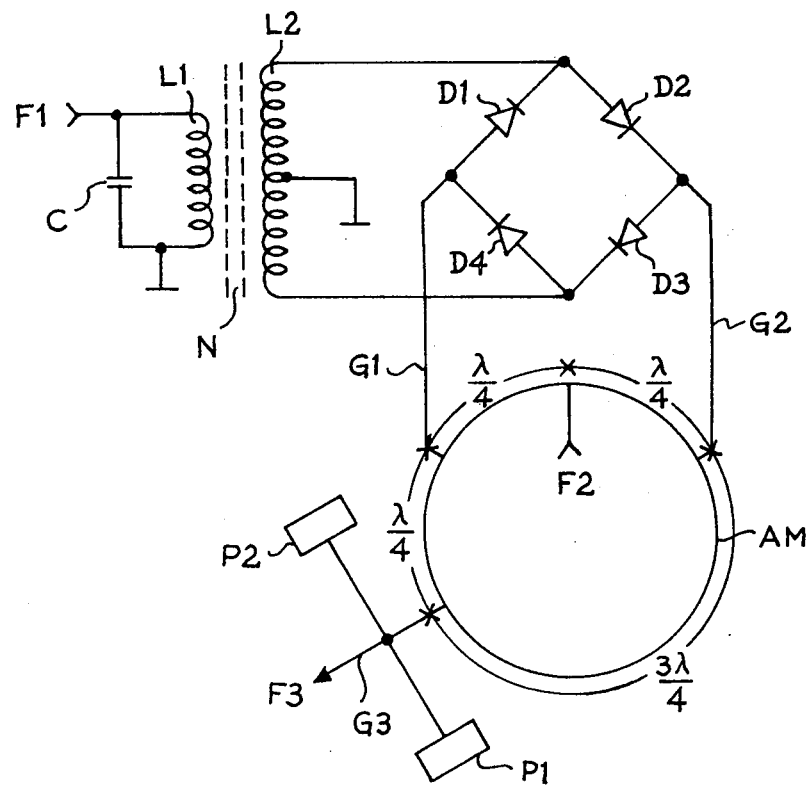
FIG. 1 which shows the simplified diagram of such an up converter.

The double-balanced up converter of the invention, the simplified diagram of which is shown in FIG. 1, uses as nonlinear element for mixing the frequencies a bridge having four diodes D1 to D4. The first wave to be mixed F1, is at a relatively low frequency, 60 MHz in the example described. It is applied to one of the ends of a primary L1 wound on a ferrite core N. The other end of this primary is connected to ground. A capacitor C enables this primary to be tuned to the frequency of the wave which is applied thereto.

A secondary L2 is wound on the same core as L1. It has a middle point connected to ground. The wave F1 appears then at the ends of this secondary with the same amplitude but phases shifted by 180°.

One of the ends of L2 is connected to the cathode of D1 and to the anode of D2. The other end is connected to the cathode of D3 and the anode of D4.

This part of the up converter is then similar to that of a radio-frequency mixer formed with discrete components.

The second wave F2 to be mixed with F1 is at a much higher frequency, 1800 MHz in the example described. It is applied to a first input of a hybrid ring AM whose circumference measures three times the half-wavelength, in the middle where it is formed, of wave F2, i.e. $3\lambda/2$.

According to a well-known property of such a ring, wave F2 appears at a distance equal to a quarter of a wavelength, i.e. $\lambda/4$, on each side of the injection point with the same amplitude and a total phase shift between these two points of 180°.

It then exits at these two points of ring AM through two hybrid guides G1 and G2 which are symmetrical with respect to a diameter passing through the injection point of F2. G1 is connected to the anode of D1 and to the cathode of D4, and G2 is connected to the cathode of D2 and the anode of D3. The length of these guides is the same so that the phase opposition at the extraction point of the ring is maintained until connection with the diode bridge.

The mixing of F1 and F2 in the diode bridge causes the appearance of a third wave F3 whose frequency is the sum of the frequencies of the incident waves, i.e. in the example described 1860 MHz.

This wave returns into ring AM which presents with respect thereto, because of the small frequency deviation with respect to F2, the same phase-shift characteristics as for this second wave. It may then be extracted from this ring, according to a characteristic also well-known, at a point situated at a quarter of a wavelength, i.e. $\lambda/4$, from the connection of guide G1, and at three-quarters of a wavelength, i.e. $3\lambda/4$, from the connection of G2. A guide G3 connected at this point of the ring enables wave F3 to be extracted so as to apply it to the device intended to receive it in the radar. To avoid any interference with the residue of wave F2 likely to exit by G3, two traps P1 and P2 tuned to the frequency of F2 are placed on each side of G3 at a small distance from the extraction point. They enable the amplitude of the residue of F2 present in G3 to be considerably attenuated.

This second part of the up converter is then very similar to an ultra-high frequency mixer formed in accordance with the hybrid technology.

In a particular embodiment, corresponding to the frequencies given above, the up converter was constructed by using the microstrip technology. This technology consists in using a sandwich formed of an intermediate dielectric layer between two conducting metal layers. One of these layers serves as ground plane and the other is etched according to any appropriate process, chemical for example, so as to obtain the desired electric circuit. The connections of this circuit have a well-defined width and form, considering the presence of the ground plane and of the dielectric layer whose permittivity may be high, spread constant microwave lines (or guides) having a well-defined characteristic impedance depending on the width of the line and on the permittivity of the dielectric.

Figure 2:
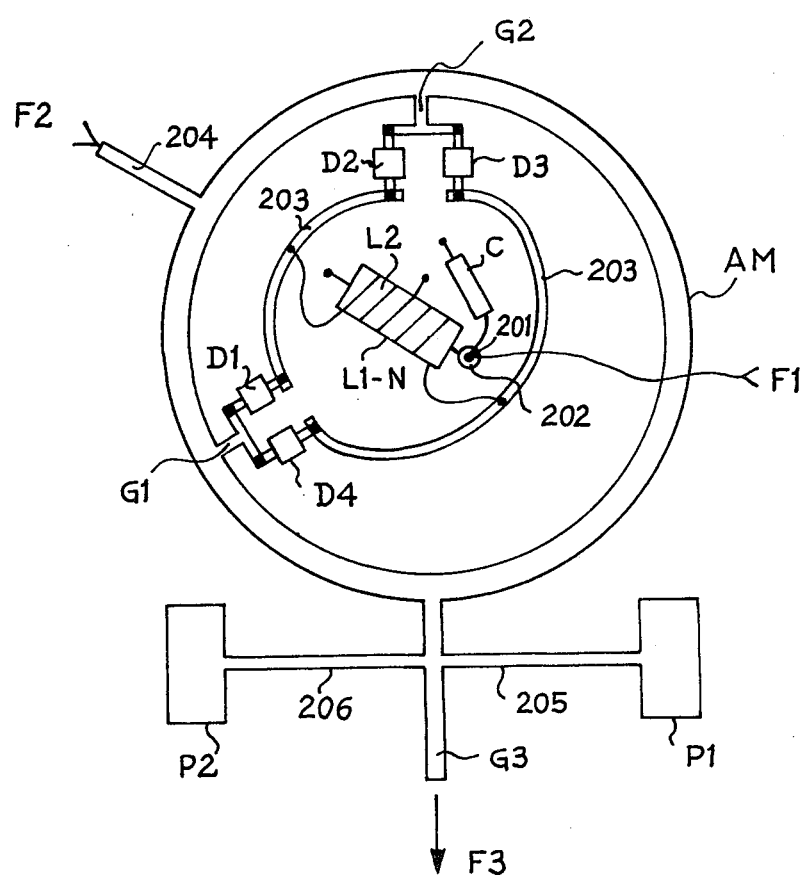
FIG. 2 which shows a top view of the implantation of this up converter in a hybrid circuit.

In this embodiment, we started with a characteristic impedance which was fixed at 50 ohms, which is a very current standard. Considering the frequencies used and mentioned above, and so as to obtain a device whose dimensions are not too high, for space-saving reasons, nor too small, for reasons of manufacturing facility, a dielectric layer was used formed of a mixture of alumina and teflon whose relative permittivity is 10. This embodiment is shown in FIG. 2 on a scale substantially equal to three and seen from the side of the layer carrying the etched circuits.

The primary L1 and the core N are formed by taking a commercially available inductance of a molded type, whose value is chosen so that, when it tuned with condenser C, its characteristic impedance is 50 ohms. One of the ends of this inductance passes through the dielectric layer so as to be soldered to the ground plane. The other end is soldered to a terminal (201) itself soldered to an annulus (202) cut out in the upper metal foil. This enables a connecting wire to be coupled to this terminal for feeding the first wave F1.

On the body of the inductance there is wound the secondary whose middle point is connected through the dielectric layer to the ground plane. The two ends of this secondary are soldered to two connection conductors 203 and 204 etched in the upper metal foil.

All these elements are situated inside the ring AM which has the form of an annulus etched in the metal foil deposited on the surface of the dielectric layer and whose width is that which gives, under the constructional conditions, the desired impedance of 50 ohms. The circumference of this annulus is equal to three times the half-wavelength in the hybrid circuit at the frequency of 1800 MHz.

Wave F2 is applied by a guide portion 204 at a point of this ring AM.

Guides G1 and G2 are connected to the internal circumference of ring AM on each side of the connecting point of guide 204 towards the inside of the ring and at a distance equal to a quarter of a wavelength, i.e. λ/4. These guides are very short and they terminate in a small portion perpendicular to the branch connected to the ring and which gives them the shape of a T.

Four microwave diodes D1 to D4, shown in the form of a square microcase current in the ultrahigh-frequency technique, are connected respectively to the ends of the transverse arms of guides G1 and G2. The other connections of these diodes are coupled respectively to the ends of connections 203 themselves coupled to the secondary L2. Thus the four-diode bridge is obtained the diagram of which is shown in FIG. 1.

A guide G3 is connected to ring AM at the outside thereof and at a point situated at a quarter of a wavelength, i.e. λ/4, from the connection point of G1 and on the side opposite to the connection point of guide 204. This guide G3 is then at a distance on the ring equal to three-quarters of a wavelength, i.e. 3λ/4, from the connection point of guide G2 on this same ring.

On this guide, and on each side, are connected, at a noncritical distance but sufficiently small so as not to increase the dimensions of the device and sufficiently large so as to clear the elements of the ring, two traps P1 and P2 having the form of two rectangles and coupled to G3 by two guide fragments 205 and 206. The dimensions of these rectangles are determined so as to form a trap tuned to the frequency of the incident wave F2, and the length of the guide fragments 205 and 206 is then substantially equal to a quarter of a wavelength, in relation with the dimensions of the rectangles in a way known per se.

In this embodiment, all the elements of the upper converter are matched and tuned to the frequencies of the different waves which pass therethrough. This enables the losses to be minimized in these elements and the decoupling of the waves among themselves to be increased.

Measurements carried out on such a circuit, at the frequencies given in this embodiment, have shown that the conversion loss of the upper converter was seven decibels. With respect to the result obtained with up converters of the prior art, the gain thus obtained is at least three decibels.

What is claimed is:

1. An up converter for mixing a first radio-frequency wave with a second ultrahigh-frequency wave and for obtaining a third ultrahigh-frequency wave, which comprises:
   a mixer diode bridge;
   a coil for feeding the first wave to the mixer diode bridge;
   a microstrip ring;
   a first microstrip waveguide for feeding the second wave to this ring;
   a second and a third microstrip waveguide for connecting the diode bridge to the ring;
   a fourth microstrip waveguide for extracting the third wave from the ring.

2. An up converter as claimed in claim 1, which further comprises two traps tuned to the second wave and connected to the fourth waveguide.

3. An up converter as claimed in claim 2, wherein the mixer bridge diode, the coil and the second and third guides are located inside the ring; the diode bridge comprising four diodes being connected in twos directly at the ends of the second and third guides and further comprising two microstrip connections for connecting the diodes to the coil.

4. An up converter as claimed in claim 3, which comprises a capacitor, and a transformer having a primary tuned by the capacitor and a secondary which forms said coil.

5. An up converter as claimed in claim 4, in which the primary is a molded inductance and the secondary is wound on this inductance.

6. An up converter as claimed in claim 5, in which the first wave is substantially at 60 MHz, the second wave at substantially 1800 MHz and the third wave at substantially 1860 MHz.

* * * * *